(12) United States Patent
Theuss et al.

(10) Patent No.: US 11,536,781 B2
(45) Date of Patent: Dec. 27, 2022

(54) MAGNETIC-SENSOR DEVICE AND METHOD FOR PRODUCING SAME

(71) Applicant: Infineon Technologies AG, Neubiberg (DE)

(72) Inventors: Horst Theuss, Wenzenbach (DE); Klaus Elian, Alteglofsheim (DE); Helmut Wietschorke, Laberweinting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/301,795

(22) Filed: Apr. 14, 2021

(65) Prior Publication Data

US 2021/0341555 A1   Nov. 4, 2021

(30) Foreign Application Priority Data

Apr. 29, 2020   (DE) .................. 102020111626.8

(51) Int. Cl.
*G01R 33/038* (2006.01)
*G01R 33/07* (2006.01)

(52) U.S. Cl.
CPC ......... *G01R 33/038* (2013.01); *G01R 33/072* (2013.01)

(58) Field of Classification Search
CPC .. G01R 33/038; G01R 33/047; G01R 33/072; G01R 33/091
USPC .................................... 324/207.2
See application file for complete search history.

(56) References Cited

U.S. PATENT DOCUMENTS

| 5,915,749 A | 6/1999 | Baldwin | |
| 10,809,322 B1* | 10/2020 | Wang | H04B 10/00 |
| 2010/0085056 A1* | 4/2010 | Baechtold | G01R 33/091 |
| | | | 324/345 |
| 2014/0312894 A1* | 10/2014 | Bartos | G01B 7/004 |
| | | | 324/252 |
| 2015/0294521 A1* | 10/2015 | Deak | G01R 33/38 |
| | | | 324/252 |
| 2017/0003357 A1* | 1/2017 | Tondra | G01R 33/091 |
| 2017/0184690 A1* | 6/2017 | Deak | H01L 43/08 |

(Continued)

FOREIGN PATENT DOCUMENTS

| DE | 2909114 B1 | 8/1980 |
| DE | 301555 A5 | 5/1992 |

(Continued)

OTHER PUBLICATIONS

Shetye, Sheetal B., Ilan Eskinazi, and David P. Arnold. "Self-assembly of millimeter-scale components using integrated micromagnets." IEEE Transactions on Magnetics 44.11 (2008): 4293-4296. (Year: 2008).*

(Continued)

*Primary Examiner* — Christopher P McAndrew
(74) *Attorney, Agent, or Firm* — Harrity & Harrity, LLP

(57) ABSTRACT

The present disclosure relates to a magnetic-sensor device comprising a circuit board made of an electrically insulating material and having conductor tracks, and comprising a permanent magnet surface-mounted on the circuit board, and a magnetic-field sensor connected to the conductor tracks of the circuit board. An SMD component for populating a circuit board is also proposed, which SMD component comprises a permanent magnet and a magnetic-field sensor.

20 Claims, 7 Drawing Sheets

(56) References Cited

U.S. PATENT DOCUMENTS

| | | | | |
|---|---|---|---|---|
| 2017/0286638 A1* | 10/2017 | Searle | ............... | G16H 40/63 |
| 2017/0343621 A1* | 11/2017 | Hahn | ............... | G01R 33/1284 |
| 2020/0081078 A1* | 3/2020 | Katti | ............... | G11C 11/16 |
| 2020/0292638 A1* | 9/2020 | Ohta | ............... | G01R 33/091 |
| 2020/0300931 A1* | 9/2020 | Saruki | ............... | G01R 33/0035 |
| 2020/0363236 A1* | 11/2020 | Cheng | ............... | G01R 33/072 |
| 2021/0018574 A1* | 1/2021 | Chen | ............... | G01R 33/0052 |

FOREIGN PATENT DOCUMENTS

| | | |
|---|---|---|
| DE | 29919131 U1 | 3/2000 |
| DE | 102006024150 A1 | 11/2007 |
| DE | 102014116842 A1 | 6/2015 |
| DE | 102014011874 A1 | 2/2016 |
| DE | 202019107291 U1 | 3/2020 |
| EP | 0678646 A1 | 10/1995 |
| EP | 3726236 A2 * | 10/2020 ........... G01R 15/202 |

OTHER PUBLICATIONS

Shetye, Sheetal Bhalchandra, Ilan Eskinazi, and David P. Arnold. "Magnetic self-assembly of millimeter-scale components with angular orientation." Journal of Microelectromechanical Systems 19.3 (2010): 599-609. (Year: 2010).*

Morris, Christopher J., et al. "Self-assembly of microscale parts through magnetic and capillary interactions." Micromachines 2.1 (2011): 69-81. (Year: 2011).*

Raković, Mirko, et al. "3-Axis Contact Force Fingertip Sensor Based on Hall Effect Sensor." International Conference on Robotics in Alpe-Adria Danube Region. Springer, Cham, 2016. (Year: 2016).*

* cited by examiner

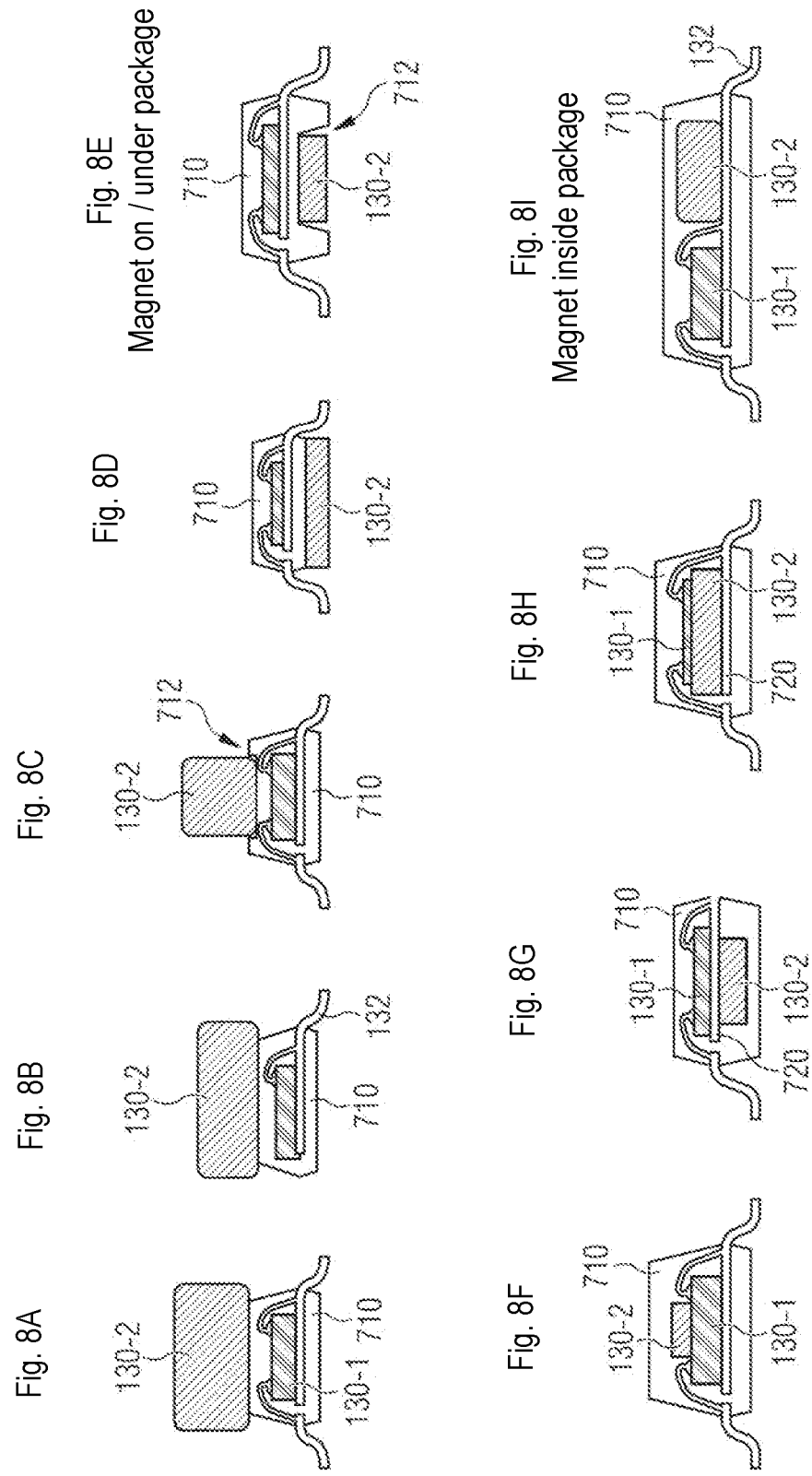

other package types (frameless...)

more than one magnet, different materials (e.g. flux concentrators)

MAGNETIC-SENSOR DEVICE AND METHOD FOR PRODUCING SAME

CROSS REFERENCE TO RELATED APPLICATION

This application claims priority to German Patent Application No. 102020111626.8 filed on Apr. 29, 2020, the content of which is incorporated by reference herein in its entirety.

TECHNICAL FIELD

The present disclosure relates generally to magnetic-sensor devices comprising magnetic sensors and permanent magnets, and in particular to designs for mounting the magnetic-sensor devices on printed circuit boards (PCB).

BACKGROUND

Magnetic sensors typically use technologies such as the Hall effect or magnetoresistive effects (MR). Examples of technologies used are GMR (giant MR), TMR, (tunnel MR) or AMR (anisotropic MR). These sensors detect variations in the magnetic field. Most of the applications use a pre-magnetization field (bias field) produced by a permanent magnet located close to the sensor. Externally moving (ferro)magnetic parts alter the pre-magnetization field at the location of the sensor, making it possible to sense moving parts. This technology is used for detecting speed, rotation, angle, position, etc.

SUMMARY

Implementations described herein provide solutions for magnetic sensors and permanent magnets for printed circuit board (PCB) technology.

According to a first aspect of the present disclosure, a magnetic-sensor device is proposed comprising a circuit board having conductor tracks, and comprising at least one permanent magnet surface-mounted on the circuit board and at least one magnetic-field sensor connected to the conductor tracks of the circuit board. Thus a combination of magnetic sensors and permanent magnets in an SMD construction (SMD=surface-mounted device) on printed circuit boards is proposed. Standard SMD and reflow processes can hence be used to populate the circuit board with the permanent magnet and the magnetic-field sensor. Reflow soldering refers to a soft-soldering technique for soldering SMD components.

In the context of the present disclosure, a printed circuit board (PCB) refers to a carrier for electronic components. It is used to provide mechanical fastening and electrical connection. Circuit boards comprise an electrically insulating material on which run conducting connections (conductor tracks). Fiber-reinforced plastic or synthetic resin bonded paper can be used as the insulating material. The conductor tracks can be etched from a thin layer of copper, for instance. Components can be soldered onto pads or into solder holes. They are thus both retained mechanically and connected electrically to these footprints. Other connection techniques are equally possible.

The magnetic sensor may be a sensor from any technology, for instance a Hall sensor, a magnetoresistive sensor (e.g. AMR sensor, GMR sensor, TMR sensor) or sensors that are a combination thereof.

The permanent magnet may be a magnet made of a hard magnetic material, for instance alloys of iron, cobalt, nickel or certain ferrites.

According to some example implementations, the permanent magnet is connected to the printed circuit board using an adhesive connection, soldered connection or snap-action connection.

According to some example implementations, the permanent magnet is arranged between the circuit board and the magnetic-field sensor or beside the magnetic-field sensor on the circuit board. The precise geometry can depend, for instance, on the field of use of the magnetic-sensor device.

According to some example implementations, the permanent magnet is embedded at least partially into an electrically conductive material, and soldered to the circuit board via the electrically conductive material. Metallizations can be used to make the permanent magnet suitable for soldering in a standard SMD process. Optionally, current can be conducted via the permanent magnet and/or the electrically conductive material to other components such as the magnetic-field sensor, for instance.

According to some example implementations, an electrically insulating layer is provided between the permanent magnet and the electrically conductive material in order to prevent any electric currents being able to flow through the permanent magnet. So an insulating coating can be employed (for example an epoxide) if a conductive magnetic material is used.

According to some example implementations, the permanent magnet is soldered to the circuit board by a bottom face, and to the magnetic-field sensor by an opposite top face. This can achieve a compact arrangement of permanent magnet and magnetic-field sensor on the circuit board.

According to some example implementations, the insulating material of the circuit board comprises a recess or cavity, in which the permanent magnet is accommodated. It is thereby possible to countersink the permanent magnet at least partially in the circuit board and to achieve an arrangement that is less tall relative to the surface of the circuit board.

According to some example implementations, the magnetic-field sensor is arranged on the circuit board over (above) the permanent magnet located in the recess. A stacked arrangement can be achieved by the recessed permanent magnet and the magnetic-field sensor arranged thereabove that nonetheless is not excessively tall relative to the surface of the circuit board.

According to some example implementations, the permanent magnet comprises at least one elastic snap-action member, and the circuit board comprises a corresponding elastic receiving member. Permanent magnet and circuit board can thereby be coupled to each other using a (detachable) snap-action connection. Thus, if applicable, it is possible to dispense with non-detachable connections such as soldering or adhesive bonding. Hence the permanent magnet is also replaceable.

According to some example implementations, the permanent magnet and the magnetic-field sensor form different SMD components mounted on the circuit board. Unlike components from through-hole technology, which are "wired components", SMD components have no wire leads but are soldered directly onto the circuit board using solderable connecting surfaces (on-board integration). This makes it easier to populate the circuit board.

According to some example implementations, the permanent magnet and the magnetic-field sensor form a single SMD component mounted on the circuit board.

According to some example implementations, the permanent magnet and the magnetic-field sensor are enclosed or housed by a shared SMD package.

According to some example implementations, the magnetic-field sensor is enclosed by an SMD package, and the permanent magnet is arranged on an external face of the SMD package, for instance in a type of piggyback arrangement. For example, the permanent magnet may be adhesively bonded to the external face.

According to another aspect of the present disclosure, a method for producing a magnetic-sensor device is proposed. The method comprises providing a circuit board made of an electrically insulating material and having conductor tracks, and surface-mounting (SMD-mounting) at least one permanent magnet on the circuit board and connecting at least one magnetic-field sensor to the conductor tracks of the circuit board. Standard SMD and reflow processes can hence be used to populate the circuit board with the permanent magnet and the magnetic-field sensor. Permanent magnets and magnetic-field sensor can hence be mounted on circuit boards using standard pick & place techniques.

According to some example implementations, the permanent magnet is surface-mounted between the circuit board and the magnetic-field sensor or beside the magnetic-field sensor on the circuit board. The precise geometry can depend, for instance, on the field of use of the magnetic-field sensor.

According to some example implementations, during surface-mounting of the permanent magnet, the circuit board is placed on a soft-magnetic material (e.g. soft-magnetic steel plate), which can be magnetized in the magnetic field of the permanent magnet. It is hence possible to fix the permanent magnet better in place while it is mounted.

According to some example implementations, the permanent magnet is surface-mounted on the circuit board by soldering or adhesive bonding.

According to some example implementations, once the permanent magnet has been fixed in place or mounted, the magnetic-field sensor and additional components are soldered onto the circuit board. For this purpose, the soft-magnetic material (e.g. steel plate) can be removed again.

According to another aspect of the present disclosure, an SMD component for populating a circuit board is proposed, which SMD component comprises a permanent magnet and a magnetic-field sensor. The SMD component or package may be an SOT (small outline transistor), TSOP (thin small outline package), QFN (quad flat no-lead) or similar package families. The final sensor contains the magnet and forms the new surface-mountable component (SMD).

According to some example implementations, the permanent magnet and the magnetic-field sensor are enclosed by a shared SMD package.

According to some example implementations, the magnetic-field sensor is enclosed by an SMD package, and the permanent magnet is arranged on an external face of the SMD package.

Dispensing with long leads allows a higher component density on the lead frames and hence a higher throughput and greater parallelism in production. Specific assembly processes such as welding, crimping or laser soldering can be avoided by the use of standard SMT processes. Complex metal grids for mounting permanent magnets and magnetic-field sensors can be replaced by low-cost circuit boards. This circuit board also offers more integration options at the system level.

BRIEF DESCRIPTION OF THE DRAWINGS

A few examples of devices and/or methods are explained in greater detail below purely by way of example with reference to the accompanying figures, in which:

FIGS. 8A-8K show side views of different example implementations of SMD components comprising magnetic sensors and permanent magnet.

DETAILED DESCRIPTION

Various examples are now described in greater detail with reference to the accompanying figures, which show a few examples. The thicknesses of lines, layers and/or regions may be exaggerated in the figures for the purpose of illustration.

Although further examples of different modifications and alternative forms are suitable, a few specific examples of such are shown in the figures and described in detail below. Nonetheless, this detailed description does not restrict further examples to the specific forms described. Further examples can cover all modifications, correspondences and alternatives that lie within the scope of the disclosure. The same or similar reference signs are used throughout the description of the figures to denote identical or similar elements which may be implemented in an identical manner to one another or in a modified form while providing the same or a similar function.

It shall be understood that if an element is described as "connected" or "coupled" to another element, the elements can be connected or coupled directly or via one or more intermediate elements. If "or" is used to combine two elements A and B, this shall be understood to mean that all possible combinations are disclosed, e.g. just A, just B, and A and B, unless specified otherwise explicitly or implicitly. An alternative wording for the same combinations is "at least one of A and B" or "A and/or B". The same applies mutatis mutandis to combinations of more than two elements.

The terminology used here to describe specific examples shall have no limiting effect on further examples. If a singular form is used, and the use of just one element is neither explicitly nor implicitly defined as obligatory, then further examples can also use plural elements in order to implement the same function. If a function is described below as implemented using a plurality of elements, further examples can implement the same function using one element or one processing entity. It shall also be understood that when the terms "comprises", "comprising", "has" and/or "having" are used, they specify the presence of the stated features, whole numbers, steps, operations, processes, elements, components and/or a group thereof, but do not rule out the presence or addition of one or more other features, whole numbers, steps, operations, processes, elements, components and/or a group thereof.

Unless defined otherwise, all the terms (including technical and scientific terms) are used here in the sense in which they are usually meant within the field associated with the examples.

Figure 1:
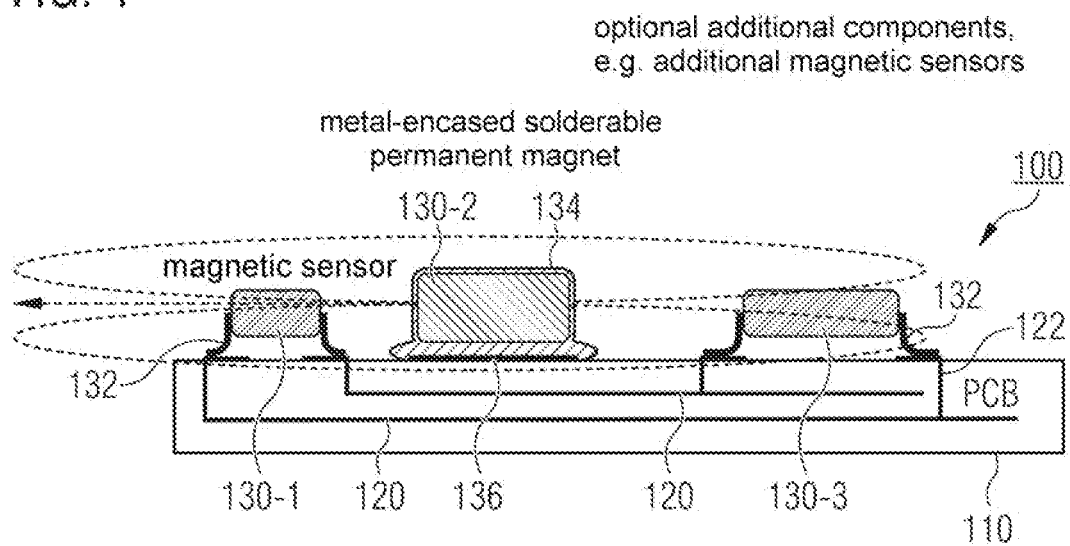
FIGS. 1-6 show different example implementations of magnetic-sensor devices.

FIG. 1 shows a magnetic-sensor device 100 according to a first example implementation.

The magnetic-sensor device 100 comprises a circuit board 110. The circuit board 110 comprises an electrically insulating material such as a fiber-reinforced plastic, for example. The circuit board 110 can have one or more layers of the electrically insulating material (multilayer circuit boards). The circuit board 110 comprises electrical conductor tracks 120 and, if applicable, vias 122. The conductor tracks 120 and vias 122 can be applied to, or respectively introduced into, the circuit board 110 by conventional techniques. A plurality of SMD components 130-1, 130-2, 130-3 are mounted on a surface of the circuit board 110. A first SMD component 130-1 is a magnetic sensor. The magnetic-field sensor 130-1 may be, for instance, a Hall sensor, an AMR sensor, a GMR sensor, or a TMR sensor. The magnetic-field sensor 130-1 is housed in an SMD chip package. The SMD package of the magnetic-field sensor 130-1 comprises solder connecting terminals 132 for providing contact between the sensor and the conductor tracks 120. Although FIG. 1 shows the solder connecting terminals on the side of the SMD package, it will be obvious to a person skilled in the art that in other implementations, the solder connecting terminals may also be located in other positions such as on a bottom face of the SMD package, for example. A permanent magnet 130-2 as the back-bias magnet for the magnetic-field sensor 130-1 is positioned on the circuit board 110 laterally beside the SMD magnetic-field sensor 130-1. The magnetic poles of the permanent magnet 130-2 can be arranged side by side in a lateral direction so that a pre-magnetization field (bias field) passes through the magnetic-field sensor 130-1 in a lateral direction. In the example implementation shown, the permanent magnet 130-2 is enclosed by a solderable metal casing 134. The metal casing 134 allows the permanent magnet 130-2 to be soldered onto the circuit board 110 using reflow processes customary for SMD technologies. For this purpose, an appropriate connecting surface 136 is provided on a surface of the circuit board 110. In the example implementation shown, no conductor tracks 120 emanate from the connecting surface for the permanent magnet 130-2. Shown laterally beside the permanent magnet 130-2 is an additional SMD component 130-3, which is coupled by its (solder) connecting terminals 132 to conductor tracks 120 of the circuit board 110. In the example implementation shown in FIG. 1, the permanent magnet 130-2 is therefore connected to the circuit board 110 via a solder connection. In the example implementation shown, the permanent magnet 130-2 is arranged laterally beside the magnetic-field sensor 130-1 on the circuit board 110. Both the magnetic-field sensor 130-1 and the permanent magnet 130-2 are in the form of SMD components and can be connected to the circuit board 110 using conventional SMD assembly techniques.

Figure 2:
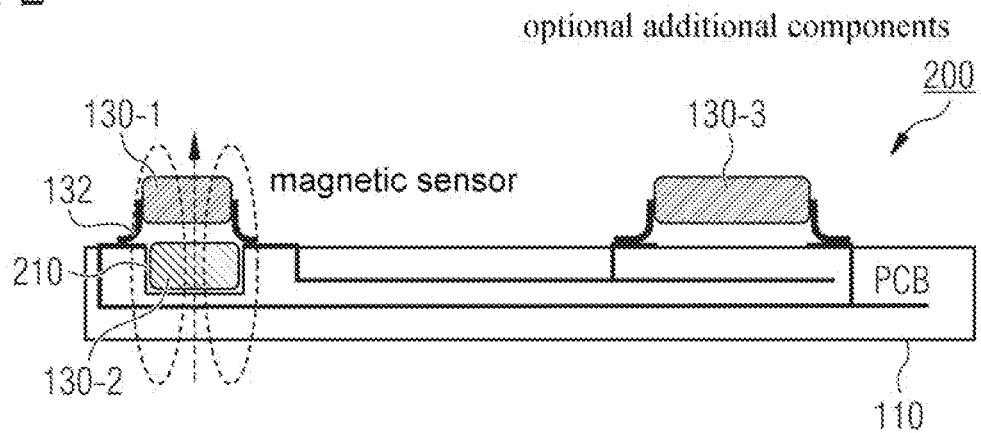

FIG. 2 shows another example implementation of a magnetic-sensor device 200.

The magnetic-sensor device 200 likewise comprises a circuit board 110 made of an electrically insulating material and having conductor tracks 120. In contrast with the example implementation of FIG. 1, the permanent magnet 130-2 here is mounted differently on the circuit board 110. In the example implementation shown, the electrically insulating material of the circuit board 110 comprises a recess or cavity 210, in which the permanent magnet 130-2 is accommodated. Dimensions of the recess 210 can be matched to dimensions of the permanent magnet 130-2 so that the permanent magnet 130-2 is accommodated in the recess 210 by a form-fit, for instance. If applicable, the permanent magnet 130-2 could also be fixed in the recess 210 using an SMD adhesive. In the example implementation shown in FIG. 2, the magnetic-field sensor 130-1 is located above the permanent magnet 130-2. The magnetic-field sensor 130-1, which is soldered by its solder connecting terminals 132 to the circuit board 110, basically covers the recess 210 and the permanent magnet 130-2 contained therein. The magnetic poles of the permanent magnet 130-2 can be arranged vertically one above the other so that a pre-magnetization field (bias field) passes vertically through the magnetic-field sensor 130-1. Using the recess 210 in the circuit board 110 means that there is no need to increase the installation space in a vertical direction.

Figure 3:
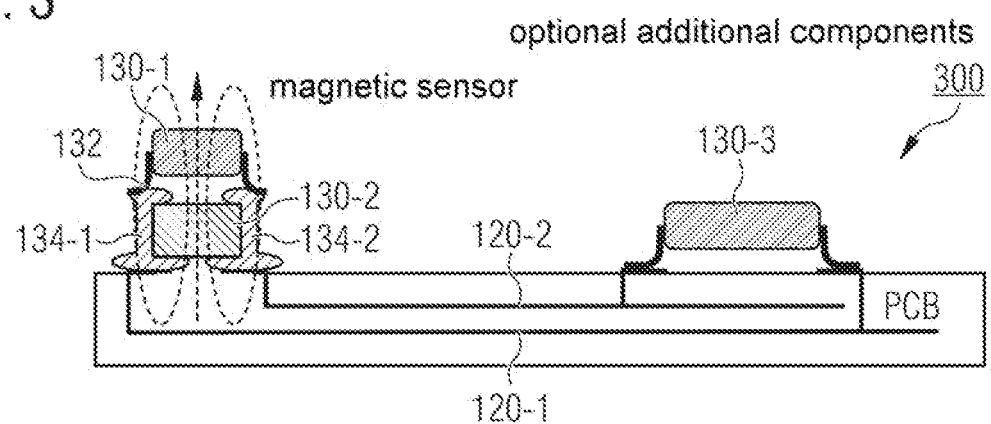

FIG. 3 shows another example implementation of a magnetic-sensor device 300, in which permanent magnet 130-2 and magnetic-field sensor 130-1 are stacked one above the other.

Unlike the variant shown in FIG. 2, the permanent magnet 130-2 is in this case soldered onto the surface of the circuit board 110 rather than embedded in a recess. Unlike the example implementation shown in FIG. 1, here the permanent magnet 130-2 is not encased entirely by electrically conductive material. Instead, a first half of the permanent magnet 130-2 is encased, as is a second half. The two partial casings 134-1 and 134-2 are electrically insulated from one another, however. In the example implementation shown, the first electrically conductive partial casing 134-1 is connected to a first conductor track 120-1. The second electrically conductive casing 134-2 is connected correspondingly to a second conductor track 120-2. For this purpose, connecting surfaces of the partial casings 134-1 and 134-2 can be soldered to connecting surfaces of the conductor tracks 120-1, 120-2. Whereas bottom faces of the partial casings 134-1, 134-2 are soldered to the circuit board 110, in the example implementation shown in FIG. 3, top faces of the electrically conductive partial casings 134-1, 134-2 are soldered to electrical connecting terminals 132 of the magnetic-field sensor 130-1. In the example implementation shown, the permanent magnet 130-2 therefore carries the magnetic-field sensor 130-1 on its top face in a piggyback fashion. The electrically conductive partial casings (metallizations) 134-1, 134-2 act as electrical connections from the connecting terminals 132 of the magnetic-field sensor 130-1 to the conductor tracks 120-1, 120-2. Again in this case, the poles of the permanent magnet 130-2 can be arranged vertically one above the other so that the magnetic field lines of the magnet pass substantially vertically through the magnetic sensor 130-1.

Figure 4:
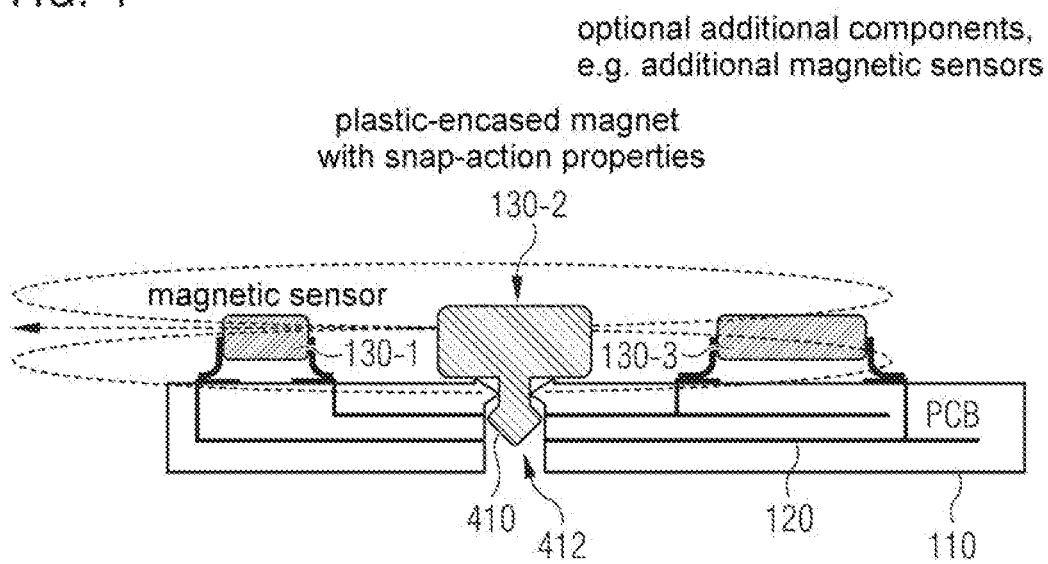

FIG. 4 shows another example implementation of a magnetic-sensor device 400.

Unlike the magnetic-sensor devices presented previously, in this example implementation the permanent magnet 130-2 is not connected to the circuit board 110 by a solder connection nor arranged in a recess of the circuit board. Instead in this case, the permanent magnet 130-2 is coupled by a (detachable) snap-action connection to the circuit board 110. For this purpose, the permanent magnet 130-2 comprises an elastic (male) snap-action member 410, which can be made of a plastic, for instance. The permanent magnet 130-2 can be encased by a plastic, for example. The circuit board 110 accordingly comprises a corresponding elastic (female) receiving member 412. In the snap-fitting process, snap-action member 410 and/or receiving member 412 are elastically deformed in such a way that the snap-action member 410 can be pushed through the receiving member 412. The snap-action member 410 has a head portion and a neck portion, with the head portion having larger dimensions than the neck portion. This prevents the snap-action member 410 from falling out of the retaining member 412. In the example implementation shown, the permanent magnet 130-2 is again arranged laterally beside the magnetic-field sensor 130-1. Poles of the permanent magnet 130-2 can lie laterally adjacent to one another so that the magnetic field lines emanating from the permanent magnet 130-2 pass through the magnetic sensor 130-1 substantially laterally. The detachable snap-action connection between circuit board 110 and permanent magnet 130-2 shown in FIG. 4 can obviously also be combined with the example implementations shown in FIG. 2 or FIG. 3.

Figure 5:
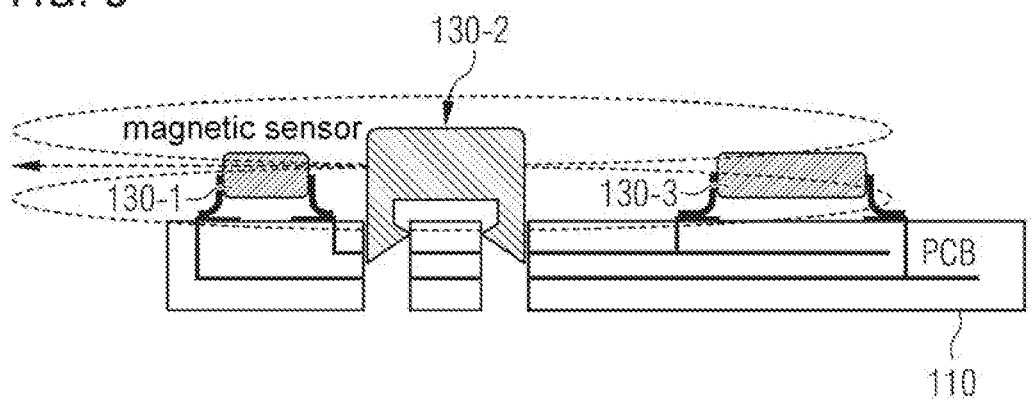

FIG. 5 shows another example implementation of a snap-action connection between permanent magnet 130-2 and circuit board 110. Unlike the example implementation of FIG. 4, in which the permanent magnet 130-2 comprises a snap-action member 410 located substantially centrally on its bottom face, the permanent magnet 130-2 of FIG. 5 comprises on its bottom face two snap-action members 410-1, 410-2, which extend downwards from the external faces. Two receiving members 412-1 and 412-2 are correspondingly provided as mating parts thereto in the circuit board 110. The variant shown in FIG. 5 can allow mechanically more stable snap-fit connections.

Figure 6:
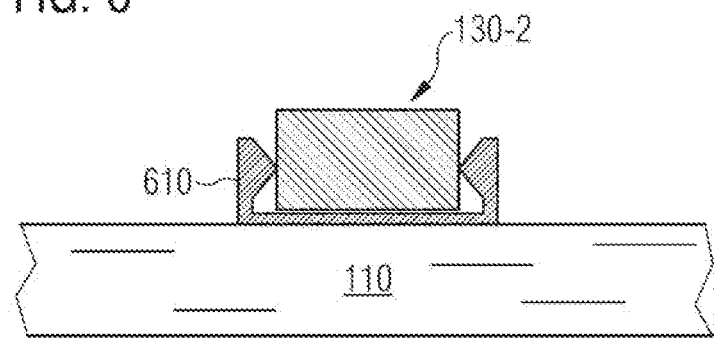

In the example implementation shown in FIG. 6, mounted on the circuit board 110 is an elastic holder 610 for the permanent magnet 130-2, into which the permanent magnet 130-2 can be inserted. The holder 610 can be soldered, clipped or adhesively bonded to the circuit board 110 according to different example implementations.

Figure 7A:
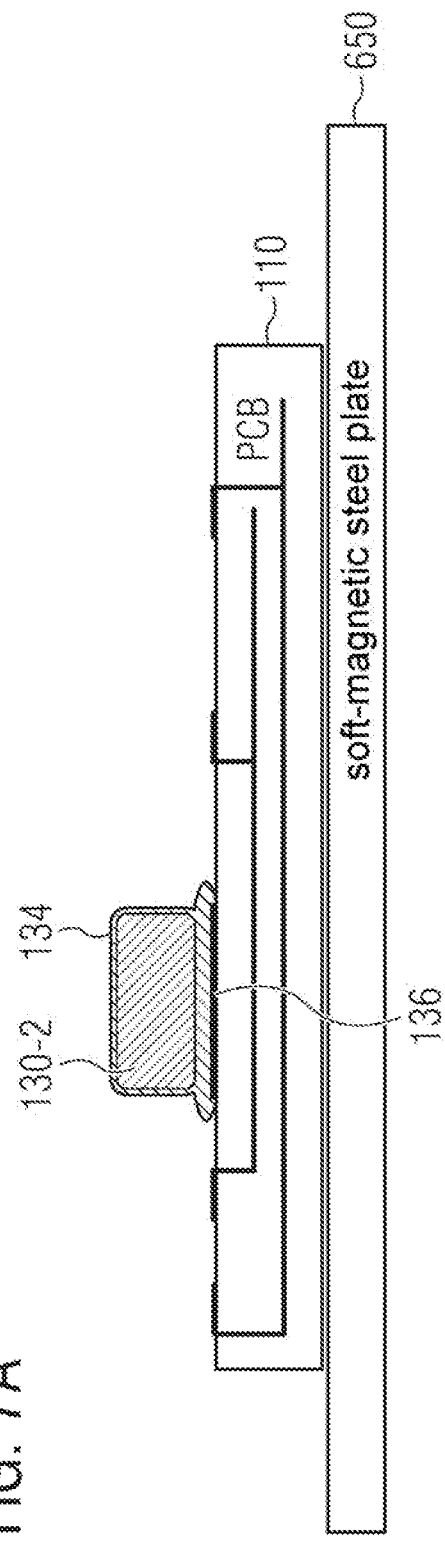
FIGS. 7A-7B show a method for populating a circuit board according to an example implementation.
Figure 7B:
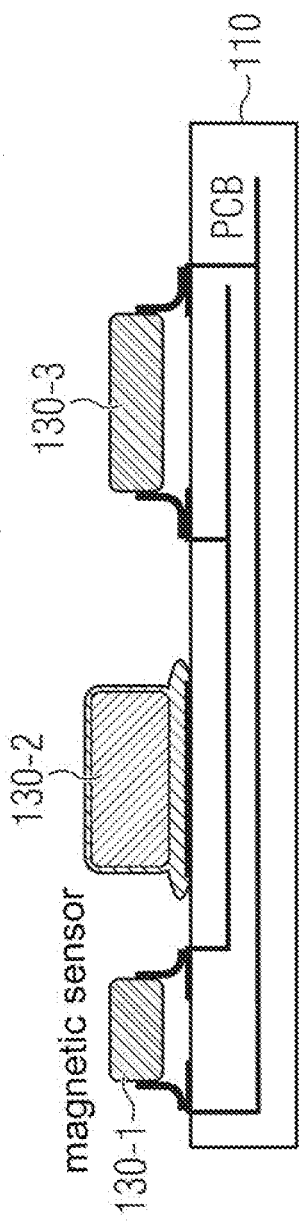

FIGS. 7A and 7B show schematically a method for producing a magnetic-sensor device according to an example implementation of the present disclosure.

In the production method, conductor tracks 120 are first printed on a circuit board 110 made of an electrically insulating material. In a further step, surface-mounting (SMD mounting) of a permanent magnet 130-2 on the circuit board 110 can be performed. This surface-mounting of the permanent magnet 130-2 can be carried out in one of the ways described above, so for instance using soldering, adhesive bonding, a snap-fit connection or embedding in a recess of the circuit board. In addition, in the production method, an SMD magnetic-field sensor 130-1 and, if applicable, further SMD components 130-3 can be connected to the conductor tracks 120 of the circuit board.

As shown schematically in FIG. 7A, the circuit board 110 can be placed on a soft-magnetic material 650 during surface-mounting of the permanent magnet 130-2. This may be a soft-magnetic steel plate 650, for example. During surface-mounting of the permanent magnet 130-2, the soft-magnetic plate 650 can be helpful in placing and/or fixing in place the permanent magnet 130-2 on the circuit board 110, and can prevent the permanent magnet 130-2 from slipping during surface-mounting. Once the permanent magnet 130-2 has been soldered or adhesively bonded on its bottom face, for instance using the circuit board 110, the soft-magnetic plate 650 can be removed again (see FIG. 7B). Then further SMD components 130-1, 130-3 can be soldered to the conductor tracks 120 of the circuit board 110.

Whereas in the previous sections of the present disclosure, magnetic-field sensor 130-1 and permanent magnet 130-2 have been mounted on a circuit board essentially as two SMD components, a further aspect of the present disclosure provides that both components are combined in a single SMD component. Thus an SMD component is also proposed that comprises a permanent magnet 130-2 and a magnetic-field sensor 130-1. This therefore allows both components to be connected to the circuit board using a single SMD assembly process for one SMD component. FIGS. 8A-K show various example implementations of the proposed SMD component in this regard.

FIGS. 8A-E show example implementations of an SMD component, in which the magnetic-field sensor 130-1 is enclosed by an SMD package 710, and the permanent magnet 130-2 is arranged on an external face of the SMD package 710. The implementation shown in FIG. 8A comprises an SMD component having solder connecting terminals on two sides for connecting the magnetic-field sensor 130-1 to the circuit board. The permanent magnet 130-2 is located on a top face of the SMD package 710, which encloses the magnetic-field sensor 130-1. This permanent magnet can be adhesively bonded to the top face of the SMD package 710, for instance. FIG. 8B shows a similar SMD component, which differs from that of FIG. 8A in that the solder connecting terminals 132 of the SMD component are provided only on one side. The permanent magnet 130-2 is in this case again in a piggyback position on the top face of the SMD package 710. The permanent magnet 130-2 is configured to be wider than the top face of the SMD package in this case. FIG. 8C shows an SMD component for which the permanent magnet 130-2 is likewise located on a top face of the SMD package 710 of the magnetic-field sensor 130-1. Unlike the example implementation in FIGS. 8A and B, in this case the permanent magnet 130-2 is narrower than the top face of the SMD package 710. In addition, for better mechanical fixation of the permanent magnet 130-2, the SMD package 710 comprises a recess 712 on the top face in order to accommodate therein a lower portion of the permanent magnet 130-2.

Whereas the example implementations shown in FIGS. 8A to 8C show the permanent magnet 130-2 on a top face of the SMD package 710, FIGS. 8D and 8E show possible example implementations in which the permanent magnet 130-2 is located on a bottom face of the SMD package. In the implementation shown in FIG. 8D, the permanent magnet 130-2 is mounted over the bottom surface of the package 710, for instance by adhesive bonding. In the example implementation shown in FIG. 8E, a recess 712, which is matched to the size of the permanent magnet 130-2 and which can accommodate the permanent magnet 130-2, is provided on the bottom face of the package 710. This can protect the permanent magnet 130-2 better from environmental influences, for example.

While FIGS. 8A to 8E have been used to describe example implementations of the SMD component for which the magnetic-field sensor 130-1 is located inside the SMD package and the permanent magnet 130-2 is located on an external face of the SMD package, FIGS. 8F to 8I show example implementations for which both the magnetic-field sensor 130-1 and the permanent magnet 130-2 are enclosed by a shared SMD package 710. According to the implementation of FIG. 8F, the permanent magnet 130-2 can be arranged inside the SMD package 710 on a top face of the magnetic-field sensor 130-1. For the variant shown in FIG. 8G, the magnetic-field sensor 130-1 is arranged inside the SMD package 710 on a top face of a lead frame 720, whereas the permanent magnet 130-2 is arranged on a bottom face of the lead frame 720. Both components, e.g. magnetic-field sensor 130-1 and permanent magnet 130-2, are again located inside a shared SMD package 710. In the example implementation shown in FIG. 8H, the permanent magnet 130-2 is mounted on a top face of the lead frame 720. On a top face of the permanent magnet 130-2 is the magnetic-field sensor 130-1. On the top face thereof are in turn connecting terminals, which are connected to the connecting terminals 132 of the lead frame 720.

Apart from the already described vertical stacked arrangements composed of magnetic-field sensor 130-1 and permanent magnet 130-2, side-by-side arrangements are obviously also possible. FIG. 8I shows an example of this. In this case, a magnetic-field sensor 130-1 and a permanent magnet 130-2 are located side by side in a shared SMD package 710. Both are arranged side by side on a common lead frame 720. Electrical connecting terminals of the magnetic-field sensor 130-1 are connected to the electrical connecting terminals of the SMD package 710.

Figure 8K:
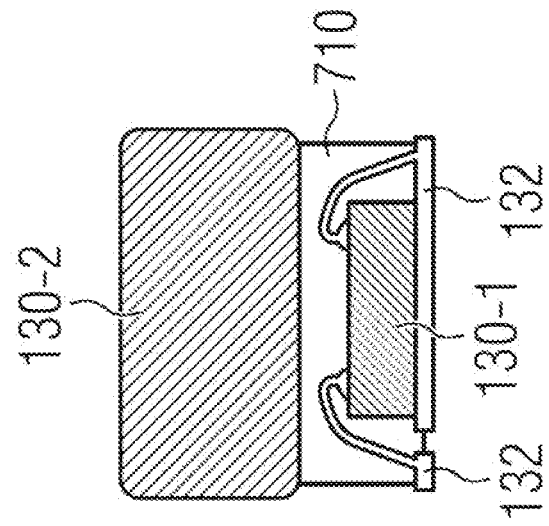
Figure 8J:
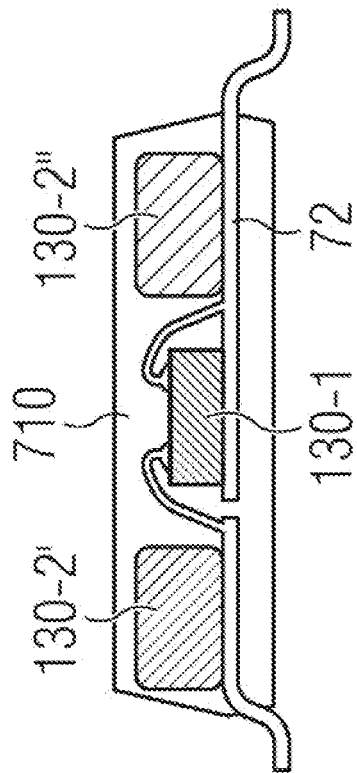
Figure 9A:
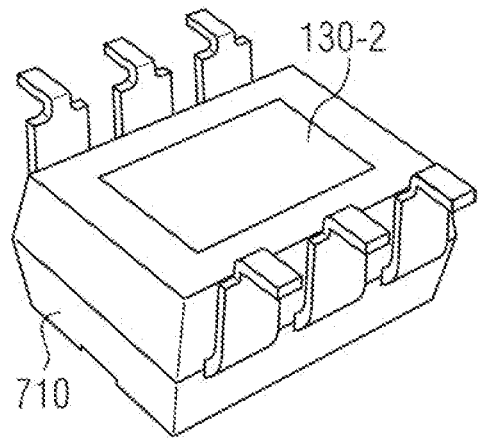
FIGS. 9A-9E show perspective diagrams of different example implementations of SMD components comprising magnetic sensors and permanent magnet.
Figure 9B:
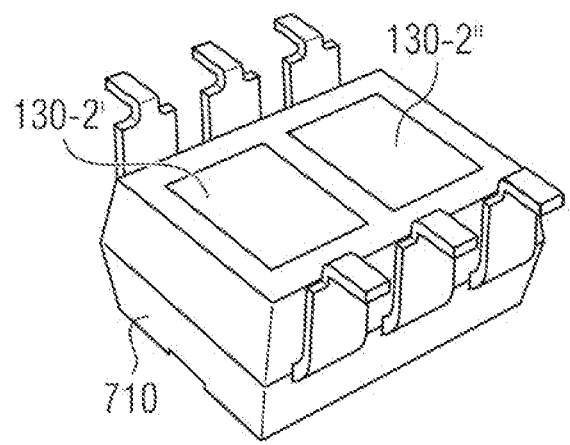
Figure 9C:
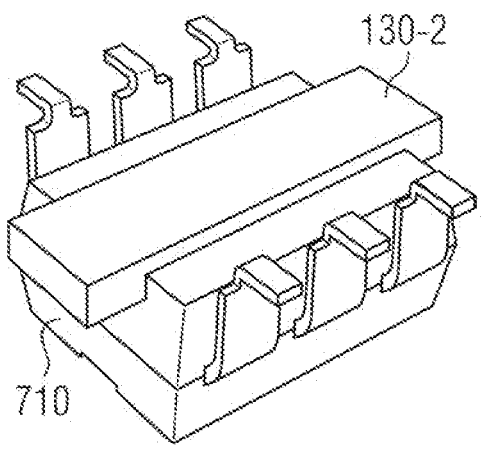
Figure 9D:
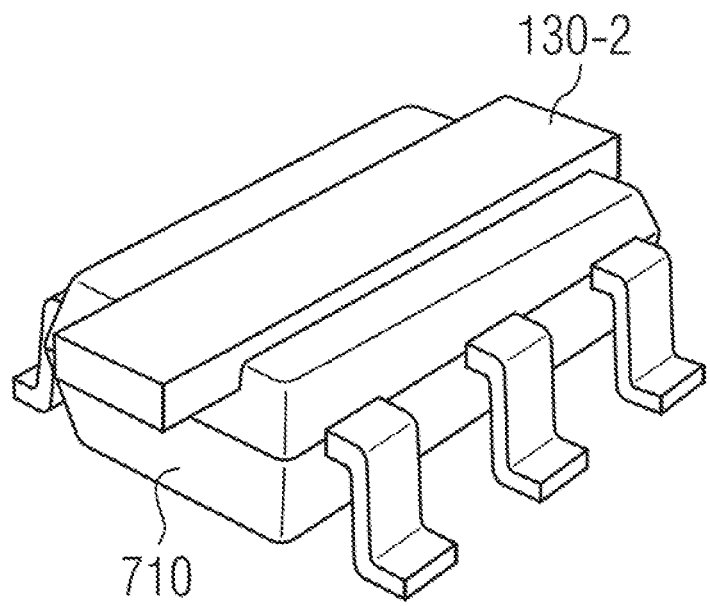
Figure 9E:
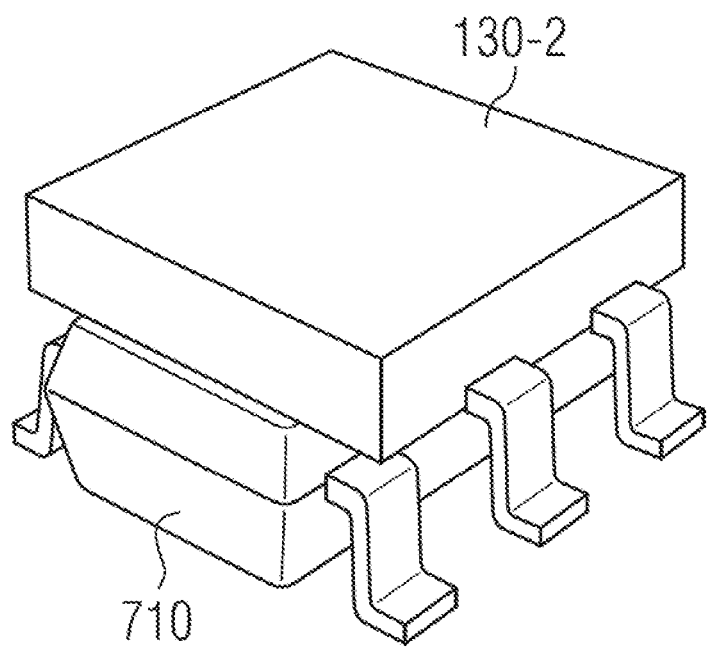

FIG. 8J shows an example implementation in which, in addition to a magnetic-field sensor 130-1, a plurality of different permanent magnets 130-2', 130-2" are arranged in a shared package 710. The different permanent magnets 130-2', 130-2" can be made of different materials or have different magnetic properties.

In addition to the SMD packages shown previously, which have solder connecting terminals on one or two sides of the package 710, obviously SMD packages are also possible that have solder connecting terminals on four sides of the package or solder connecting terminals on the bottom face of the package 710. FIG. 8K shows such an example implementation, in which the solder connecting terminals are provided on the bottom face of the SMD package 710.

In addition, FIG. 9 shows in a perspective diagram different variants of SMD components in which one or more permanent magnets are located on an external face of the SMD package. FIG. 9A shows an SMD component for which a permanent magnet 130-2 is located on a bottom face of the package 710. In this case, the permanent magnet 130-2 is recessed into a matching recess. In the variant shown in FIG. 9B, two permanent magnets 130-2', 130-2" are provided adjacent to one another on the bottom face of the package 710. Each of the permanent magnets 130-2', 130-2" is recessed for this purpose into a corresponding recess. The variant in FIG. 9C shows a permanent magnet 130-2 on a bottom face of an SMD package 710, with the permanent magnet 130-2 extending beyond a length of the SMD package. The permanent magnet 130-2 is therefore longer than the package 710 in this case. The two example implementations of FIGS. 9D and 9E each show variants in which the permanent magnet 130-2 is located on a top face of the SMD package 710. In the example implementation of FIG. 9D, the permanent magnet 130-2 is recessed in a dedicated recess on the top face of the package 710. The permanent magnet 130-2 in this case extends by way of example beyond a length of the package 710, so is longer than the package 710. In the variant of FIG. 9E, the permanent magnet 130-2 is mounted on a surface of the package 710, for instance by adhesive bonding. The permanent magnet 130-2 shown here is approximately as long as the package 710, although slightly wider.

It will be obvious to a person skilled in the art that the example implementations shown here purely by way of example are used merely for illustrating the principle according to the implementation, and can provide only a small overview of possible implementation forms. A large number of other implementations are conceivable.

The present disclosure proposes combining magnetic sensors and permanent magnets on printed circuit boards. A multiplicity of geometries is possible in which the permanent magnet is mounted behind, above, or below the sensor IC. Special metallizations can be used to make the magnet suitable for soldering in a standard SMD process. When using a conductive magnetic material, a prior insulating coating (e.g. an epoxide) can be used. Selective metallization of the magnet above the sensor is proposed. The magnet can be mounted on circuit boards using standard pick & place techniques.

Example implementations of the proposed SMD component are a combination of a surface-mountable sensor package (e.g. known as a SOT, TSOP, QFN or similar package families) with a permanent magnet. The final sensor contains the magnet and forms the new surface-mountable component (SMD). There are various options for achieving this:

1. Fixing (e.g. adhesively bonding) the permanent magnet on the top or bottom face of a finished standard SMD sensor package.

2. As 1., but a product-specific geometry can be used instead of a standard geometry: the molding is shaped so that it holds the magnet. Cavities or other structures act as placement features for fixing the magnet. Tolerances (magnet to sensor) can hence be widened, which can be important for advanced technologies such as TMR or GMR. In addition, the air gap (or the mold thickness, which in magnetic terms behaves as an air gap), between sensor and magnet can be reduced further. This can result in improved sensitivity.

3. The magnet can be inserted in the package prior to encapsulation (potting), typically after die-/wire-bonding. Options: stacking on the chip, mounting between chip and lead frame, mounting on the underside of the lead frame, or side-by-side mounting. This can further reduce the chip/magnet air gap.

4. Mounting more than one magnetic part: certain sensors use a specific design of the magnetic field distribution. This can be achieved, for instance, by using more than one magnet or by using different magnets having different geometries and/or magnetic properties. Example: one of the magnets can be a permanent magnet and the other a flux concentrating part (this is a metal having ferromagnetic properties, a very high magnetic permeability and a very low coercivity. It attracts the magnetic field lines and hence modifies the local magnetic field distribution. Certain geometries can also strengthen the magnetic field locally. This type of part is sometimes also referred to as a "flux concentrator" in these applications.)

First, dispensing with long leads allows a higher component density on the lead frames and hence a higher throughput and greater parallelism in production. In addition, the use of standard SMT processes makes it possible to organize specific assembly processes such as welding, crimping or laser soldering. A complex metal grid can be replaced by a low-cost circuit board. This circuit board also offers more integration options at the system level.

The aspects and features described together with one or more of the examples and figures detailed above can also be combined with one or more of the other examples in order to replace an identical feature of the other example or to introduce the feature into the other example.

The description and drawings present only the principles of the disclosure. Moreover, all the examples set out here are expressly intended fundamentally for illustrative purposes only in order to assist the reader in understanding the principles of the disclosure and the concepts contributed by the inventor(s) for developing the technology further. All statements here relating to principles, aspects and examples of the disclosure and specific examples thereof include their counterparts.

For instance, a block diagram can present an outline circuit diagram that implements the principles of the disclosure. Likewise, a flow diagram, a flow chart, a state-transition diagram, a pseudocode and such like can represent different processes, operations or steps, which are presented, for example, mainly in a computer-readable medium and hence are executed by a computer or processor, regardless of whether such a computer or processor is shown explicitly. Methods disclosed in the description or in the claims can be implemented by a component comprising means for executing each of the respective steps of these methods.

It shall be understood that the disclosure of a plurality of steps, processes, operations or functions disclosed in the description or the claims shall not be interpreted as being in the specified order unless stated otherwise explicitly or implicitly, for instance for technical reasons. Therefore the disclosure of a plurality of steps or functions does not restrict these to a specific order unless these steps or functions are not interchangeable for technical reasons. In addition, in some examples, a single step, function, process or operation can include a plurality of substeps, subfunctions, subprocesses or suboperations and/or can be broken down into same. Such substeps can be included and be part of the disclosure of this single step unless explicitly excluded.

Furthermore, the following claims are hereby incorporated in the detailed description, where each claim can stand alone as a separate example. Although each claim can stand alone as a separate example, it should be noted that—even though a dependent claim can refer in the claims to a specific combination with one or more other claims—other examples can also include a combination of the dependent claim with the subject matter of every other dependent or independent claim. Such combinations are proposed here explicitly unless stated that a certain combination is not intended. In addition, it is intended that features of one claim are included for every other independent claim even if this claim is not made directly dependent on the independent claim.

The invention claimed is:

1. A magnetic-sensor device comprising:
    a circuit board made of an electrically insulating material and having conductor tracks;
    a permanent magnet mounted on the circuit board,
        wherein the permanent magnet is surface-mounted on the circuit board or surface-mounted on the circuit board via a conductive material; and
    a magnetic-field sensor connected to the conductor tracks of the circuit board.

2. The magnetic-sensor device as claimed in claim 1, wherein the permanent magnet is connected to the circuit board using at least one of an adhesive connection, soldered connection, or snap-action connection.

3. The magnetic-sensor device as claimed in claim 1, wherein the permanent magnet is arranged between the circuit board and the magnetic-field sensor or beside the magnetic-field sensor on the circuit board.

4. The magnetic-sensor device as claimed in claim 1, wherein the permanent magnet is embedded at least partially into an electrically conductive material, and soldered to the circuit board via the electrically conductive material.

5. The magnetic-sensor device as claimed in claim 4, wherein an electrically insulating layer is provided between the permanent magnet and the electrically conductive material.

6. The magnetic-sensor device as claimed in claim 1, wherein the permanent magnet is soldered to the circuit board by a bottom face, and to the magnetic-field sensor by an opposite top face.

7. The magnetic-sensor device as claimed in claim 1, wherein the insulating material of the circuit board comprises a recess, in which the permanent magnet is accommodated.

8. The magnetic-sensor device as claimed in claim 7, wherein the magnetic-field sensor is arranged on the circuit board above the permanent magnet located in the recess.

9. The magnetic-sensor device as claimed in claim 2, wherein the permanent magnet comprises at least one elastic snap-action member, and the circuit board comprises a corresponding elastic receiving member.

10. The magnetic-sensor device as claimed in claim 1, wherein the permanent magnet and the magnetic-field sensor form a single surface-mounted device (SMD) component mounted on the circuit board.

11. The magnetic-sensor device as claimed in claim 10, wherein the permanent magnet and the magnetic-field sensor are enclosed by a shared SMD package.

12. The magnetic-sensor device as claimed in claim 10, wherein the magnetic-field sensor is enclosed by an SMD package, and the permanent magnet is arranged on an external face of the SMD package.

13. A method for producing a magnetic-sensor device, comprising:
    providing a circuit board made of an electrically insulating material and having conductor tracks;
    mounting a permanent magnet on the circuit board,
        wherein the permanent magnet is surface-mounted on the circuit board or surface-mounted on the circuit board via a conductive material; and
    connecting a magnetic-field sensor to the conductor tracks of the circuit board.

14. The method as claimed in claim 13, wherein the permanent magnet is surface-mounted between the circuit board and the magnetic-field sensor or beside the magnetic-field sensor on the circuit board.

15. The method as claimed in claim 13, wherein during surface-mounting of the permanent magnet, the circuit board is placed on a soft-magnetic material.

16. The method as claimed in claim 13, wherein the permanent magnet is surface-mounted on the circuit board by soldering or adhesive bonding.

17. The method as claimed in claim 13, wherein once the permanent magnet has been fixed in place, the magnetic-field sensor and additional components are soldered onto the circuit board.

18. A surface-mounted device (SMD) component for populating a circuit board, wherein the SMD component comprises:
    a permanent magnet configured to be surface-mounted on the circuit board,
        wherein the circuit board is made of an electrically insulating material and includes conductor tracks; and
    a magnetic-field sensor configured to be connected to the conductor tracks of the circuit board.

19. The SMD component as claimed in claim 18, wherein the permanent magnet and the magnetic-field sensor are enclosed by a shared SMD package.

20. The SMD component as claimed in claim 18, wherein the magnetic-field sensor is enclosed by an SMD package, and the permanent magnet is arranged on an external face of the SMD package.

* * * * *